(12) United States Patent
Kim et al.

(10) Patent No.: US 6,963,033 B2
(45) Date of Patent: Nov. 8, 2005

(54) BALL GRID ARRAY ATTACHING MEANS HAVING IMPROVED RELIABILITY AND METHOD OF MANUFACTURING SAME

(75) Inventors: Sang-Young Kim, Cheonan (KR); Ho-Jeong Moon, Cheonan (KR); Dong-Kil Shin, Taejeon (KR); Seung-Kon Mok, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/032,478

(22) Filed: Jan. 2, 2002

(65) Prior Publication Data

US 2003/0051909 A1 Mar. 20, 2003

Related U.S. Application Data

(63) Continuation-in-part of application No. 09/954,026, filed on Sep. 18, 2001.

(51) Int. Cl.[7] .............................................. H05K 1/16
(52) U.S. Cl. .................... 174/260; 174/261; 174/267; 257/737
(58) Field of Search ................................ 174/261, 267, 174/260; 257/737, 738

(56) References Cited

U.S. PATENT DOCUMENTS

| | | | | |
|---|---|---|---|---|
| 5,410,807 A | * | 5/1995 | Bross et al. ................... | 29/843 |
| 5,468,995 A | * | 11/1995 | Higgins, III ................. | 257/697 |
| 5,767,580 A | * | 6/1998 | Rostoker ..................... | 257/737 |
| 5,959,355 A | * | 9/1999 | Petit .......................... | 257/737 |
| 6,084,781 A | * | 7/2000 | Klein ......................... | 361/771 |
| 6,122,177 A | | 9/2000 | Kitano et al. | |
| 6,204,455 B1 | * | 3/2001 | Gilleo et al. ................. | 174/261 |
| 6,303,408 B1 | * | 10/2001 | Smith ......................... | 438/106 |
| 6,310,301 B1 | * | 10/2001 | Heinrich et al. ............ | 174/260 |
| 6,337,445 B1 | * | 1/2002 | Abbott et al. ............... | 174/260 |

OTHER PUBLICATIONS

"Double Sided 4Mb SRAM Coupled Cap PBGA Card Assembly Guide", Application Note, International Business Machines, pp. 1–11, (2/98).

"MicroStar BGA™ Packaging Reference Guide", Texas Instruments, Literature No.: SSYZ015A, Second Edition, (Sep. 1999) [18 pages].

* cited by examiner

*Primary Examiner*—Kamand Cuneo
*Assistant Examiner*—Jeremy Norris
(74) *Attorney, Agent, or Firm*—Lee & Sterba, P.C.

(57) ABSTRACT

An array of solder structures comprising a plurality of radially-curved exterior surfaces, each one enclosing a predetermined-sized cavity that can be used for flexibly joining together at predetermined conductive contact points two planar elements having dissimilar properties. By assembling the two planar elements in a tiered arrangement, one planar element having an array of annular conductive pads and the other planar element having either a corresponding array of annular or circular conductive pads, separated by an array of spherical solder balls comprised of solder and a fluxing agent, a hollow solder structure can be created during a melting and subsequent cooling of the solder compound. The plasticity/resiliency characteristics of the resulting hollow solder structure absorbs lateral movement of the two planar elements relative to each other without degradation of the solder joint.

36 Claims, 4 Drawing Sheets

BALL GRID ARRAY ATTACHING MEANS HAVING IMPROVED RELIABILITY AND METHOD OF MANUFACTURING SAME

RELATED APPLICATION DATA

This application is a Continuation-In-Part of U.S. patent application Ser. No. 09/954,026, filed Sep. 18, 2001, by Sang-Young KIM, et al., entitled "Hollow Solder Structure Having Improved Reliability and Method of Manufacturing Same."

BACKGROUND OF THE INVENTION

1. Field of the Invention

The present invention relates to an electronic device having a Ball Grid Array (BGA) solder mounting system and, more particularly, to a BGA system having an array of hollow solder balls and a method for manufacturing the same.

2. Description of the Related Art

A common mounting and electrical-connection mechanism used in integrated circuits (ICs) is a ball grid array (BGA), wherein small solder balls are placed and retained at each one of a multitude of connection pads of the IC for solder connection to a mounting substrate or planar surface having opposing metal connecting pads. When heat is applied, the solder balls liquefy and flow via a fluxing agent included in the solder compound over any exposed metal surfaces of the connection pads, thereby forming a reliable electrical connection with each mounting pad. After cooling, the hardened solder additionally provides a rigid mounting structure for mechanically retaining the IC to the substrate or planar surface.

Typically, the size of the mounting package for the IC can be reduced to the size of a semiconductor chip, thus creating a Chip Size Package or Chip Scale Package (CSP). In the CSP, unlike conventional periphery-leaded (i.e. wire-bonded) packages, an array of external terminals and the BGA solder balls are distributed over the surface of the IC to directly interconnect the package to a printed circuit board (PCB). After processing, the resulting solder structures are generally inelastic, and provide a solid mounting mechanism for the assembly.

Disadvantageously, since the material composition of the chip and the opposing epoxy-glass material of a conventional PCB can have widely mismatched Coefficient of Thermal Expansion (CTE), any thermal cycling effects, such as those normally associated with turn-on and turn-off of related circuitry, can produce differing expansion movement of the opposing planar surfaces. This movement produces lateral shearing stresses on the solder joint, which is absorbed by the solder balls, more specifically by the junction of the solder ball and the metal connecting pads. With repeated thermal cycling, metal fatigue at this junction can cause the solder structure to crack and fail, rendering an entire circuit board inoperable. In other words, when the chip heats up during use, both the chip and the board expand, and when the heat is removed, both the chip and the substrate shrink. The problem that arises is that the chip and the substrate expand and contract at different rates according the CTE, thereby stressing the interconnections or solder balls connecting them.

FIG. 1 illustrates a cross-sectional view of a conventional ball grid array (BGA) interface structure 10 having a multitude of solid solder balls 12. Structure 10 consists of upper planar element 14 having an array of first metal conductor pads 16 rigidly connected via a plurality of solder balls 12 to an array of lower planar elements 18 having a plurality of second metal conductor pads 20 so as to provide both electrical and mechanical connection between electronic circuits on each of the planar elements. Conductors are separated from lateral neighboring conductors of the array by isolation spaces 22 appropriately located on each planar element. Each of planar elements 14 and 18 can have a different CTE. However, an excessive disparity between the CTEs can produce thermal cycling failure in the form of cracking of the rigid solder joints as previously discussed.

Occasionally, conventional out-gassing of vaporized flux is not completed due to process and/or solder compound irregularities, such as insufficient wetting of the solder compound, and results in small voids being located at the conductor-solder interfaces. Such voids create an area of fatigue weakness in the resulting joining structures.

FIG. 2 illustrates a cross-sectional area of a conventional BGA structure, wherein small voids 24 due to insufficient conventional wetting are shown at the junction of one or more of the plurality of conductor pads 16 and solder balls 12 in the array. Such voids 24 are formed when each of the molten solder balls 12 wets on the associated conductor pad 16, and the flux in the solder paste compound flows outward from the center of the conductor pad 16. As the temperature of the solder compound rises further, the flux is vaporized and a major portion of the flux vapor is dissipated into the atmosphere. However, minor portion of this vapor remains trapped in solder ball 12 as it is cooled and forms the small voids 24 inside the solder ball 12.

The configurations shown in FIGS. 1 and 2 are susceptible to cracking at each joint connecting the rigid conductor pad 16 and the rigid solder ball 12 under application of opposing lateral forces on the planar elements 14 and 18. Such a failure of both the electrical connection and the mechanical mounting mechanism has heretofore precluded the use of epoxy-glass as a reliable substrate material for BGA chip attachment applications, in favor of a more expensive ceramic material which has a CTE closer to that of the chip. Similarly, attachment of ceramic carrier modules, such as hybrids and CSPs, to an epoxy-glass printed circuit board is precluded for the same reason. A detailed joint interface of solder balls used in a conventional BGA type semiconductor device mounting construction is disclosed, for example, in U.S. Pat. No. 6,122,177 and PAJ No. 1998-209591. Detailed manufacturing assembly technical reports from International Business Machines Corporation, entitled "Doubled-Sided 4 Mb SRAM Coupled Cap PBGA Card Assembly Guide," and from Texas Instrument Corporation, entitled "MicroStar BGA Packaging Reference Guide," would also be beneficial to the reader.

The prior art addresses the presence of these small voids in the solder balls and a resulting joint embrittlement as significant problems. A small void in this context is defined as a gaseous volumetric displacement within the interior of a solder ball due to thermal expansion (i.e. boiling) of low-temperature solder flux solvents, since such gas material will remain trapped within a cooled solder structure. Conventional solder processing typically incorporates a warm-up period to allow time for de-gassing of such solvents, thereby minimizing such voids to yield a recommended finished total gaseous volume of less than 0.1% of the total solder structure volume. Disadvantageously, such heating can prematurely dry the solder paste included in the solder ball, leading to degraded electrical connections.

Thus, conventional BGA structures are not sufficient to prevent solder cracking or the breakage of solder ball interconnection, especially when used with a chip and an epoxy-glass substrate. Therefore, what is needed is a newly designed CSP with improved interconnection reliability, especially between the chip and the PCB, and a method of manufacturing of the same.

SUMMARY OF THE INVENTION

In a preferred embodiment of the present invention, improved reliability of an array of solder ball connections in a ball grid array (BGA) semiconductor device may be attained using an array of resilient solder bonding structures, each structure comprising a solder ball having a curved exterior surface enclosing an interior cavity, with each structure connecting a plurality of conductive contact pads on a first planar surface to a corresponding plurality of conductive contact pads on a second planar surface. The presence of such interior cavities produces a plurality of thin-walled solder structures that have sufficient resiliency and flexibility to "bend" under laterally applied stresses, such as movement of the first planar surface relative to the second planar surface during thermal expansion or vibration, thereby removing stress vectors that would occur at each one of a plurality of joints between the conductive contact pads and the solder ball.

The interior cavity of each one of the array of resilient solder bonding structures may comprise a volume that equals from 1% to 90% of the exterior volume of the melted and cooled solder ball. Such interior cavities may be controllably formed via a seeding catalyst preferably in the form of an annular ring in contact with a solder ball having a volatile fluxing agent. The conductive arrays may be formed on contact pads having annular, circular, or other geometric patterns that may be conducive to forming such interior cavities during the melting and subsequent cooling of the solder balls. Opposing contact pads of the individual planar substrates may be identical or different.

According to the preferred embodiment of the present invention, a connection system comprises a resilient ball grid array (BGA) electrical and mechanical attachment means for attaching a first planar substrate to a second planar substrate. The connection system comprises a plurality of solder ball structures, each solder ball structure having a curved exterior surface enclosing a first volume and having an interior cavity having a displacement constituting a second volume, each solder ball structure attaching one of a plurality of first metal contacts on the first planar substrate to an associated one of a plurality of second metal contacts on the second planar substrate.

The first and second planar substrates may comprise a first and second printed circuit board (PCB) being joined together, wherein the first and/or second printed circuit boards may be made of organic or inorganic materials. The first and second planar substrates may individually or together be comprised of one or more materials from the group consisting of plastic, ceramic, and epoxy-glass. The first and second planar substrates may be comprised of materials and forms that may be characterized as being an integrated circuit (IC), an IC carrier, a leadframe, a generally rigid substrate, or a flexible substrate. The first and second surfaces may have the same or different properties. For example, in addition to a chip-to-PCB and a PCB-to-PCB connection array, various other interconnections may be made, such as ceramic carrier to PCB, chip to ceramic carrier, or plastic module substrate to PCB or other plastic module substrate.

These and other features of the present invention will be readily apparent to those of ordinary skill in the art upon review of the detailed description that follows.

DETAILED DESCRIPTION OF THE INVENTION

Figure 1:
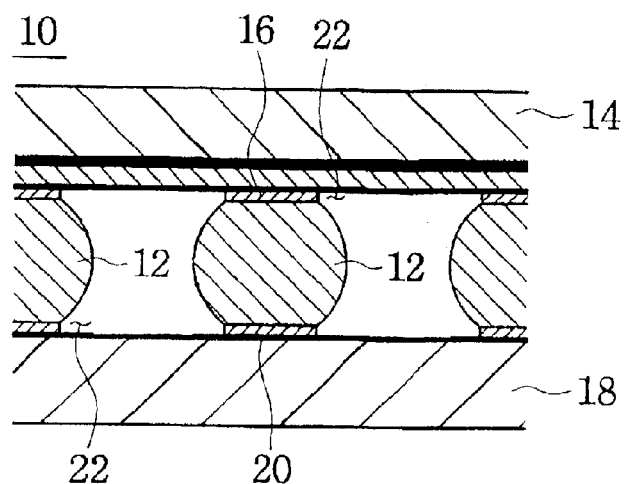
FIG. 1 illustrates a cross-sectional view of a conventional ball grid array (BGA) interface structure having a multitude of solid solder balls.
Figure 2:
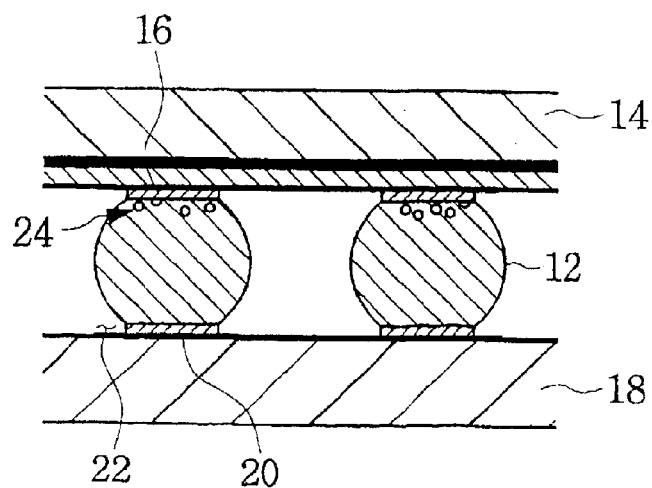
FIG. 2 illustrates a cross-sectional area of a conventional BGA structure, wherein small voids due to insufficient conventional wetting are shown at the junction of conductor pad and solder ball.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shapes and thickness of elements may be exaggerated for clarity, and the same reference numerals appearing in different drawings represent the same element.

Figure 3:
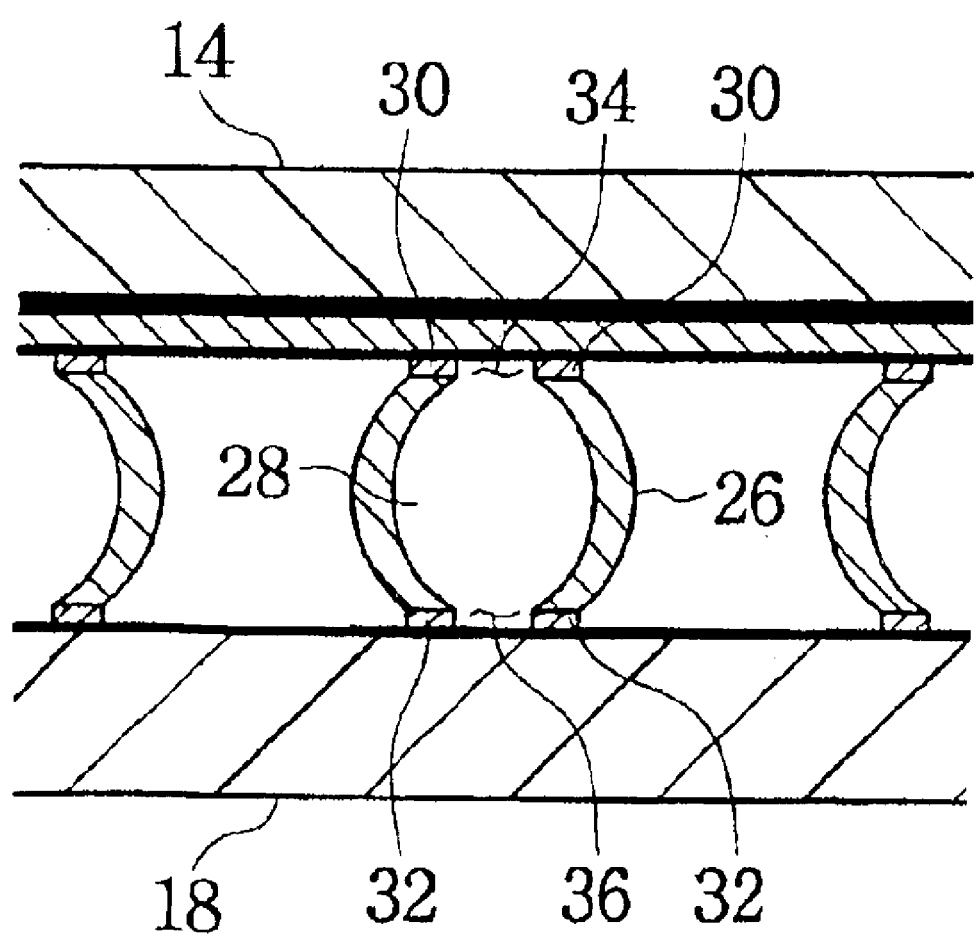
FIG. 3 illustrates a cross-sectional view of a barrel-shaped solder structure featuring a large void according to a preferred embodiment of the present invention.

FIG. 3 illustrates a cross-sectional view of an array of barrel-shaped solder structures 26, each featuring a central cavity 28 according to a preferred embodiment of the present invention. Through the use of a plurality of annular conductor pads 30 configured as an array on upper planar element 14, a plurality of first "seeding" points may be created by the accumulation of vaporized flux at the non-conducting/non-wetting centers of the annuli. By including an opposing array of annular conductor pads 32 on lower planar element 18, a plurality of second "seeding" points may be created.

After placement of a plurality of solder balls at the center of each annular conductor pad 32 and retention preferably using an adhesive, such as a tape, upper planar element 14 is preferably placed and retained on the plurality of high-volatility solder balls, such that associated annular conductor pads are aligned. The assembly is then heated to bring the plurality of high-volatility solder balls to the melting point of the solder. As the vapor expands during solder heating and liquefication, a first interior cavity is formed at each array location on upper planar element 14 that is contained by the surface tension and viscosity of the molten solder. The first interior cavity joins with a second interior cavity similarly formed on lower planar element 18 to produce the resulting interior cavity 28. In the molten solder state, the upper planar element 14 will float on the liquefied solder balls, causing a natural aligning of the opposing conductor pads 30 and 32 due to surface tension equilibrium of the plurality of liquefied solder balls.

The surface tension properties also force the formation of an exterior convex shape on the liquefied structure, that when cooled, solidifies in the barrel-shaped form of FIG. 3, due to solidification of the outer shell before the vaporized fluxing agent in the interior can contract.

During heating, the solder compound does not wet at hole areas 34 and 36 of annular conductor pads 30 and 32 under an epoxy resin (or polyimide tape) because the contact angle is 180° between the epoxy resin (or polyimide tape) and solder ball 26. Exemplary land holes 34 and 36 are approximately 0.1 mm diameter. The small voids surrounding the land holes 34 and 36 merge and become concentrated, and the large void 28 is initiated at these point. Relative volumes of the cavity can range from 1% to 90% of the total volume of the solder structure. The volume of the cavity may be controlled by controlling the temperature and time during heating of the solder. The composition of the solder should balance the properties of the solder and solder-alloys with the properties of a fluxing vapor. Specifically, an exemplary solder compound can consist of portions any of the general soldering materials, such as solder, silver, and tin, and a fluxing agent, such as one or more from the group of rosin, resin, activator, thixotropic agent, and a high temperature boiling solvent.

Figure 4:
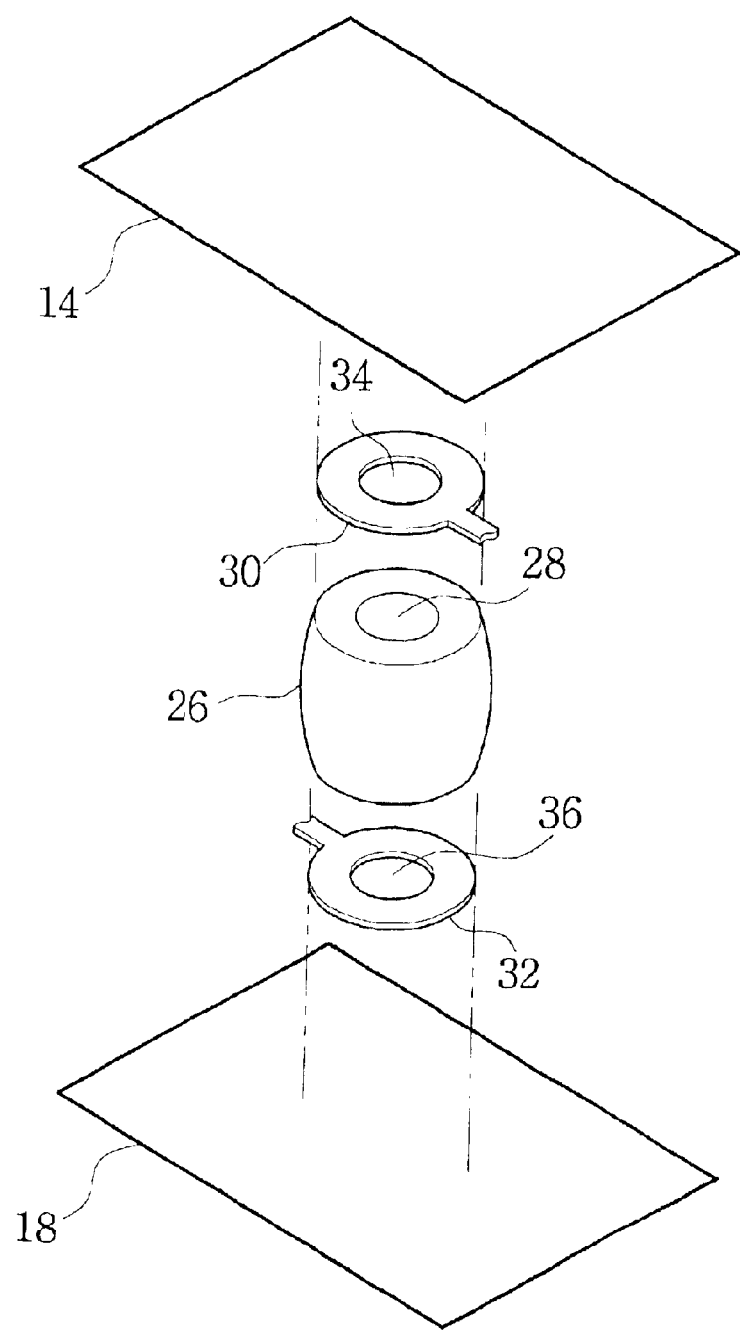
FIG. 4 illustrates a cross-sectional view of the solder structure shown in FIG. 3 under conditions where lateral stress forces are applied to the planar elements in directions that tend to move planar elements in opposite directions.

FIG. 4 illustrates a cross-sectional view of the array of solder structures shown in FIG. 3 under conditions of lateral stress forces being applied in directions that tends to move planar elements 14 and 18 in opposite directions. The skew of the plurality of barrel-shaped solder structures 26 illustrates the bending motion of the flexible walls of solder structures 26 such that potentially destructive stress forces are neutralized and reduced or removed from junction areas 38 and 40.

Figure 5:
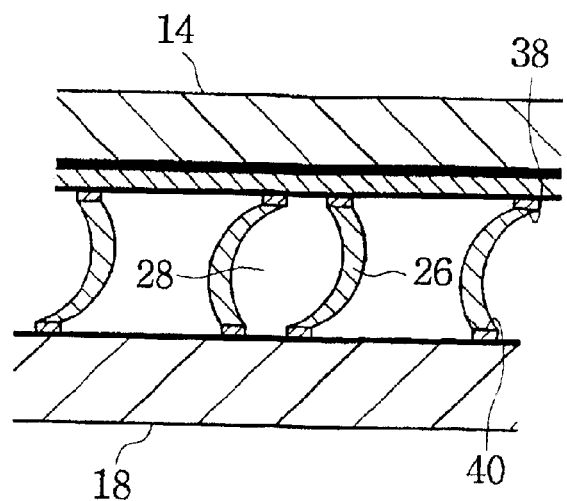
FIG. 5 illustrates a cross-sectional view of a solder structure according to an alternative embodiment of the present invention wherein one planar element has an annular conductor pad and the other planar element has a circular conductor pad.

FIG. 5 illustrates an array of solder structures 42 according to an alternative embodiment of the present invention, wherein planar element 14 has a plurality of circular conductor pads 44, and planar element 18 has a plurality of annular conductor pads 46. This arrangement creates at each array location a solder structure 48 having a circular or tear-drop shape, that still retains the thin flexible walls 50. The plurality of annular conductor pads can be located on either upper planar element 14 or lower planar element 18, with the plurality of circular conductor pads on the opposing surface with the result that there is an attendant effect that locates the cavity coincident with each hole of the annulus.

Figure 6:
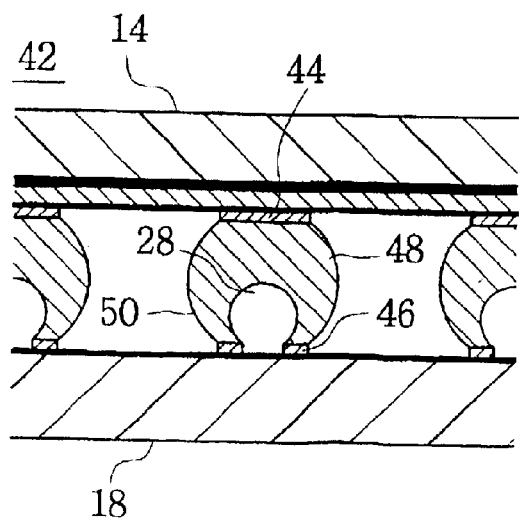
FIG. 6 illustrates the bending motion in responses to lateral stress forces similar to those shown in FIG. 4.

FIG. 6 illustrates the bending motion of the array of solder structures shown in FIG. 5 in response to lateral stress forces similar to those shown in FIG. 4. Similar to the structure shown in FIG. 4, the potentially destructive stress forces are neutralized or absorbed by the flexible walls of the solder structure and reduced or eliminated at the junctions 44 and 46 between solder ball 48 and the planar elements 14 and 18, respectively. Although the solder structure of FIG. 5 is shown to have thicker walls, manipulation of the solder composition and applied thermal parameters, including both variations of temperature and time, can produce a wall thickness of any desired dimension.

The size of the resulting cavity 28 is dependent on several physical and chemical factors, including without limitation: flux-solder weight ratios composing the solder compound; type and properties of the solder materials included in the solder compound; type and relative vaporization or boiling point of the fluxing agent used; relative size of the central hole in the annular ring 34 and 36 to the diameter of the annulus 30 and 32; relative size of the annulus versus the initial diameter of the spherical solder ball 26 and 48; relative separation distance of planar elements 14 and 18 versus the diameter of the spherical solder ball 26 and 48; and rates, magnitudes, and dwell times of temperature changes on the assembly. Further, different qualitative measurements can be used. For example, although mixing the solder compound by weight is a convenient measure for determining relative portions of each element, volumetric measure can also be used. Determination of a resultant solder structure can also be addressed as a ratio of gas versus solder volumes, wall thickness versus total diameter of the structure width dimension, or cavity diameter versus planar separation distance, and still be within the scope of the present invention.

Thus, with the preferred embodiments of the present invention, the stresses applied to the various joints can be significantly dissipated or reduced. Accordingly, interconnection reliability can be significantly improved in accordance with the present invention. With the embodiments of the present invention, ceramic carrier modules having arrays of connecting pads, such as hybrids and CSPs, can be reliably attached to an opposing array of contact pads on an epoxy-glass printed circuit board. Similarly, such resilient bonding arrays allow for the bonding of PCB-to-PCB in such a way that a directional "grain" of the PCBs is not relevant. Further, bonding of chips to wafers, chips to chips, etc can all benefit from such a resilient bonding array. The resiliency benefits are not restricted to neutralizing thermal expansion forces, but have applicability in environments having degrading mechanical forces, such as motor vibrations, for example.

Further, the invention is not restricted to IC-to-IC or substrate, nor IC-to-PCB, but any variation and type of semi-rigid planar to planar interface the require resilient mechanical and electrical connection. Such planar interfaces may or may not have differing CTEs to derive the benefits of the resilient bonding structure. Thus, the flexibility afforded by the embodiments of the present invention provides improved reliability in adverse thermal and mechanical environments.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An array of resilient solder bonding structures, each solder bonding structure comprising a solder ball connecting a contact pad on a first surface to a contact pad on a second surface, each solder ball having a continuous curved exterior surface which, together with the first surface and the contact pad of the first surface and with the second surface and the contact pad of the second surface, defines a total volume of the solder bonding structure and completely encloses an interior cavity defined by an interior surface of the solder bonding structure, the interior cavity having a displacement constituting a second volume, wherein the interior cavity is in direct contact with the interior surface of the solder bonding structure and the second volume is not less than about 1% and not more than about 90% of the total volume of the solder bonding structure.

2. The array of resilient solder bonding structures as claimed in claim 1, wherein the contact pad on the first surface and the contact pad on the second surface are annular.

3. The array of resilient solder bonding structures as claimed in claim 1, wherein the contact pad on the first surface is annular and the contact pad on the second surface is circular.

4. A resilient ball grid array (BGA) electrical and mechanical attachment means for attaching an integrated circuit to a planar substrate, comprising a plurality of solder ball structures, each solder ball structure attaching one of a plurality of conductive contact pads on the integrated circuit to an associated one of a plurality of conductive contact pads on the planar substrate and having a continuous curved exterior surface which, together with the integrated circuit and the one of a plurality of conductive contact pads on the integrated circuit and with the planar substrate and the associated one of a plurality of conductive contact pads on the planar substrate, defines a total volume of each solder ball structure and completely encloses an interior cavity defined by an interior surface of the solder ball structure, the interior cavity having a displacement constituting a second volume, wherein the interior cavity is in direct contact with the interior surface of the solder ball structure and the second volume is not less than about 1% and not more than about 90% of the total volume of the solder ball structure.

5. The resilient BGA attachment moans as claimed in claim 4, wherein the plurality of conductive contact pads on the integrated circuit and the plurality of conductive contact pads on the planar substrate are annular.

6. The resilient BGA attachment means as claimed in claim 5, wherein the plurality of conductive contact pads on the integrated circuit or the plurality of conductive contact pads on the planar substrate are circular.

7. A resilient ball grid array (BGA) electrical and mechanical attachment means for attaching an integrated circuit to a printed circuit board, comprising a plurality of solder ball structures, each solder ball structure attaching one of a plurality of conductive contact pads on the integrated circuit to an associated one of a plurality of conductive contact pads on the printed circuit board and having a continuous curved exterior surface which, together with the integrated circuit and the one of a plurality of conductive contact pads on the integrated circuit and with tho printed circuit board and the one of a plurality of conductive contact pads on the printed circuit board, defines a total volume of each solder ball structure and completely encloses an interior cavity defined by an interior surface of the solder ball structure, the interior cavity having a displacement constituting a second volume, wherein the interior cavity is in direct contact with the interior surface of the solder bonding structure and the second volume is not less than about 1% and not more than about 90% of the total volume of the solder ball structure.

8. The resilient ball grid array (BGA) electrical and mechanical attachment means as claimed in claim 7, wherein a substrate of the printed circuit board is made of organic materials.

9. The resilient ball grid array (BGA) electrical and mechanical attachment means as claimed in claim 7, wherein a substrate of the printed circuit board is made of inorganic materials.

10. The resilient ball grid array (BGA) electrical and mechanical attachment means as claimed in claim 7, wherein the plurality of conductive contact pads on the integrated circuit and the plurality of conductive contact pads on the printed circuit board are annular.

11. The resilient ball grid array (BGA) electrical and mechanical attachment means as claimed in claim 7, wherein the plurality of conductive contact pads on the integrated circuit or the plurality of conductive contact pads on the printed circuit board are circular.

12. A resilient ball grid array (BGA) electrical and mechanical attachment means for attaching a first planar substrate to a second planar substrate, comprising a plurality of solder ball structures, each solder ball structure attaching one of a plurality of conductive contact pads on the first planar substrate to an associated one of a plurality of conductive contact pads on the second planar substrate and having a continuous curved exterior surface which, together with the first planar substrate and the one of a plurality of conductive contact pads on the first planar substrate and with the second planar substrate and the associated one of a plurality of conductive contact pads on the second planar substrate, defines a total volume of each solder ball structure and completely encloses an interior cavity defined by an inner surface of the solder ball structure, the interior cavity having a displacement constituting a second volume, wherein the interior cavity is in direct contact with the interior surface of the solder ball structure and the second volume is not less than 1% and not more than 90% of the total volume of the solder ball structure.

13. The resilient ball grid array (BGA) electrical and mechanical attachment means as claimed in claim 12, wherein the first and second planar substrates are first and second printed circuit boards, respectively.

14. The resilient ball grid array (BGA) electrical and mechanical attachment means as claimed in claim 13, wherein the first and second printed circuit boards are made of organic materials.

15. The resilient ball grid array (BGA) electrical and mechanical attachment means as claimed in claim 13, wherein the first and second printed circuit boards are made of inorganic materials.

16. The resilient ball grid array (BGA) electrical and mechanical attachment means as claimed in claim 12, wherein the plurality of conductive contact pads on the first planar substrate and the plurality of conductive contact pads on second planar substrate are annular.

17. The resilient ball grid array (BGA) electrical and mechanical attachment means as claimed in claim 12, wherein the plurality of conductive contact pads on the first planar substrate or the plurality of conductive contact pads on the second planar substrate are circular.

18. The resilient ball grid array (BGA) electrical and mechanical attachment means as claimed in claim 12, wherein the first and second planar substrates are comprised of one or more materials selected from the group consisting of plastic, ceramic, and epoxy-glass.

19. An array of resilient solder bonding structures, each solder bonding structure comprising a solder ball connecting a conductive contact pad on a first surface to a conductive contact pad on a second surface, each solder ball having an exterior wall having a first end and a second end, the first end being connected to the conductive contact pad on the first surface and the second end being connected to the conductive contact pad on the second surface; and a cavity enclosed by the exterior wall of the solder ball.

20. An array of resilient solder bonding structures as claimed in claim 19, wherein the cavity communicates with an inner hole of the first conductive contact pad on the first surface.

21. An array of resilient solder bonding structures as claimed in claim 20, wherein the cavity communicates with an inner hole of the second conductive contact pad on the second surface.

22. An array of resilient solder bonding structures as claimed in claim 19, wherein the solder ball is a cylindrical solder structure.

23. An array of resilient solder bonding structures as claimed in claim 22, wherein the cylindrical solder structure has a barrel-shaped exterior.

24. An array of resilient solder bonding structures as claimed in claim 19, wherein the exterior wall of the solder structure is flexible.

25. An array of resilient solder bonding structures as claimed in claim 19, wherein a volume of the cavity of the cylindrical solder structure is not less than 1% and not more than 90% of an entire volume of the cylindrical solder structure.

26. An array of resilient solder bonding structures as claimed in claim 19, wherein a material of the solder structure comprises a solder fluxing agent and a mixture of one or more selected from the group consisting of solder, silver, and tin.

27. An array of resilient solder bonding structures as claimed in claim 26, wherein the solder fluxing agent comprises more than one selected from the group consisting of rosin, resin, activator, thixotropic agent and a high temperature boiling solvent.

28. A resilient ball grid array (BGA) electrical and mechanical attachment means for attaching a first planar substrate to a second planar substrate, comprising a plurality of solder ball structures, each solder ball structure attaching one of a plurality of conductive contact pads on the first planar substrate to an associated one of a plurality of conductive contact pads on the second planar substrate, each solder ball having an exterior wall having a first end and a second end, the first end being connected to the one of a plurality of conductive contact pads on the first planar substrate and the second end being connected to the associated one of a plurality of conductive contact pads on the second planar substrate; and a cavity enclosed by the exterior wall of the solder ball.

29. A resilient ball grid array (BGA) electrical and mechanical attachment means for attaching a first planar substrate to a second planar substrate as claimed in claim 28, wherein the cavity communicates with an inner hole of the first annular conductive pad.

30. A resilient ball grid array (BGA) electrical and mechanical attachment means for attaching a first planar substrate to a second planar substrate as claimed in claim 29, wherein the cavity communicates with an inner hole of the second annular conductive pad.

31. A resilient ball grid array (BGA) electrical and mechanical attachment means for attaching a first planar substrate to a second planar substrate as claimed in claim 28, wherein the solder structure is a cylindrical solder structure.

32. A resilient ball grid array (BGA) electrical and mechanical attachment means for attaching a first planar substrate to a second planar substrate as claimed in claim 31, wherein the cylindrical solder structure has a barrel-shaped exterior.

33. A resilient ball grid array (BGA) electrical and mechanical attachment means for attaching a first planar substrate to a second planar substrate as claimed in claim 28, wherein the exterior wall of the solder structure is flexible.

34. A resilient ball grid array (BGA) electrical and mechanical attachment means for attaching a first planar substrate to a second planar substrate as claimed in claim 28, wherein a volume of the cavity of the cylindrical solder structure is not less than 1% and not more than 90% of an entire volume of the cylindrical solder structure.

35. A resilient ball grid array (BGA) electrical and mechanical attachment means for attaching a first planar substrate to a second planar substrate as claimed in claim 28, wherein a material of the solder structure comprises a solder fluxing agent and a mixture of one or more selected from the group consisting of solder, silver, and tin.

36. A resilient ball grid array (BGA) electrical and mechanical attachment means for attaching a first planar substrate to a second planar substrate as claimed in claim 35, wherein the solder fluxing agent comprises more than one selected from the group consisting of rosin, resin, activator, thixotropic agent and a high temperature boiling solvent.

* * * * *